United States Patent
Li et al.

(10) Patent No.: US 8,013,753 B2
(45) Date of Patent: Sep. 6, 2011

(54) METHOD FOR DETECTING OPERATIONS OF A POWER STORAGE DEVICE AND RELATED POWER STORAGE DEVICE

(75) Inventors: Po-Hsine Li, Taipei Hsien (TW); Chih-Hung Chen, Taipei Hsien (TW); Chia-Hung Chen, Taipei Hsien (TW)

(73) Assignee: Wistron Corporation, Xizhi Dist., New Taipei (TW)

( * ) Notice: Subject to any disclaimer, the term of this patent is extended or adjusted under 35 U.S.C. 154(b) by 495 days.

(21) Appl. No.: 12/348,325

(22) Filed: Jan. 5, 2009

(65) Prior Publication Data

US 2010/0073176 A1 Mar. 25, 2010

(30) Foreign Application Priority Data

Sep. 23, 2008 (TW) ................................ 97136457 A

(51) Int. Cl.
*G08B 21/00* (2006.01)
(52) U.S. Cl. ................ 340/644; 340/636.1; 340/636.12; 340/636.13; 340/638; 340/664
(58) Field of Classification Search .................. 340/638, 340/636.1, 636.12, 636.13, 636.17, 644, 340/650, 653, 662, 664; 320/136, 152, 161, 320/162
See application file for complete search history.

(56) References Cited

U.S. PATENT DOCUMENTS

| | | | | |
|---|---|---|---|---|
| 5,744,984 A | * | 4/1998 | Drapac et al. | 327/89 |
| 5,783,998 A | * | 7/1998 | Nakajou et al. | 340/636.15 |
| 6,075,344 A | * | 6/2000 | Kawai | 320/134 |
| 7,956,581 B2 | * | 6/2011 | LiTingTun | 320/134 |
| 2008/0274395 A1 | * | 11/2008 | Shuster | 429/61 |

FOREIGN PATENT DOCUMENTS

CN 1821801 A 8/2006
JP 200858085 A 3/2008

OTHER PUBLICATIONS

Office action mailed on Mar. 23, 2011 for the China application No. 200810166131.1, p. 3 line 6-17 and line 21-22 and line 25-26, p. 4 line 1-3 and line 7-22, p. 5 line 2-3 and line 5-9 and line 12-18 and line 20-22 and line 24-25, p. 6 line 2-4 and line 7-8 and line 10-15.

* cited by examiner

*Primary Examiner* — Hung T. Nguyen
(74) *Attorney, Agent, or Firm* — Winston Hsu; Scott Margo

(57) ABSTRACT

A method for detecting operations of a power storage device is disclosed. The power storage device includes an electricity storage unit for storing power output from an electronic device or outputting power to the electronic device. The method includes detecting current between the electricity storage unit and the electronic device to determine whether the electricity storage unit is malfunctioned and causes short circuit, and generating an alarm signal when the electricity storage unit is malfunctioned and causes short circuit.

16 Claims, 5 Drawing Sheets

METHOD FOR DETECTING OPERATIONS OF A POWER STORAGE DEVICE AND RELATED POWER STORAGE DEVICE

BACKGROUND OF THE INVENTION

1. Field of the Invention

The present invention relates to a method for detecting operations of a power storage device and related power storage device, and more particularly, to a method and related power storage device for detecting malfunction of the power storage device.

2. Description of the Prior Art

A power storage device (e.g. rechargeable battery) is a device capable of iteratively being charged and discharged, and commonly used in portable products, such as mobile phone and personal digital assistant (PDA). In addition, the power storage device can instantly provide backup power and prevent the related system from malfunction due to power outage. Thus, the power storage device is commonly used in a backup power system (e.g. uninterruptible power supply, and battery backup unit).

For example, a redundant array of independent disks (RAID) system combines multiple hard disks into one logic partition, and is regarded as a single hard disk for operation system. Therefore, when system power is off, RAID must store related configurations or temporary (unwritten) data in a memory module to ensure that RAID works well when the system restarts. In order to enhance operating efficiency, the memory module is a volatile memory such as random access memory (RAM). Since data stored in the volatile memory is erased due to power outage, RAID has to provide power for the memory module via an extra power storage device (e.g. Battery Backup Unit) when system stops providing power due to shutdown or other factors, for example, blackout.

Thus, through a rechargeable power storage device, RAID ensures that the memory module can keep data and maintain operation well when power outage occurs. However, according to the prior art, the power storage device only possesses rechargeable function without any malfunction detection performed. In other words, once malfunction occurs on the power storage device while the user is not aware of the malfunction, RAID will be out of function because of power outage.

In short, according to the prior art, the power storage device only possesses rechargeable function without any malfunction detection performed. This could cause the related system malfunctioned.

SUMMARY OF THE INVENTION

It is therefore an objective of the present invention to provide a method for detecting operations of a power storage device and related power storage device.

The present invention discloses a method for detecting operations of a power storage device. The power storage device includes an electricity storage unit which is used for storing power output from an electronic device or outputting power to the electronic device. The method includes detecting current between the electricity storage unit and the electronic device to determine whether the electricity storage units is malfunctioned and causes short circuit, and generating an alarm signal when the electricity storage unit is malfunctioned and causes short circuit.

The present invention further discloses a power storage device which is used for receiving power output from an electronic device or outputting power to the electronic device. The power storage device includes an electricity storage unit, a switching module, a detecting unit and an alarm unit. The electricity storage unit is used for storing electricity or outputting stored electricity. The switching module is coupled between the electricity storage unit and the electronic device, and used for controlling a connection between the electricity storage unit and the electronic device according to current between the electricity storage unit and the electronic device. The detecting unit is coupled to the electricity storage unit, the switching module and the electronic device, and used for detecting current through the electricity storage unit and generating a detecting result when the switching module cuts off the connection between the electricity storage unit and the electronic device. The alarm unit is coupled to the detecting unit, and used for generating an alarm signal according to the detecting result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
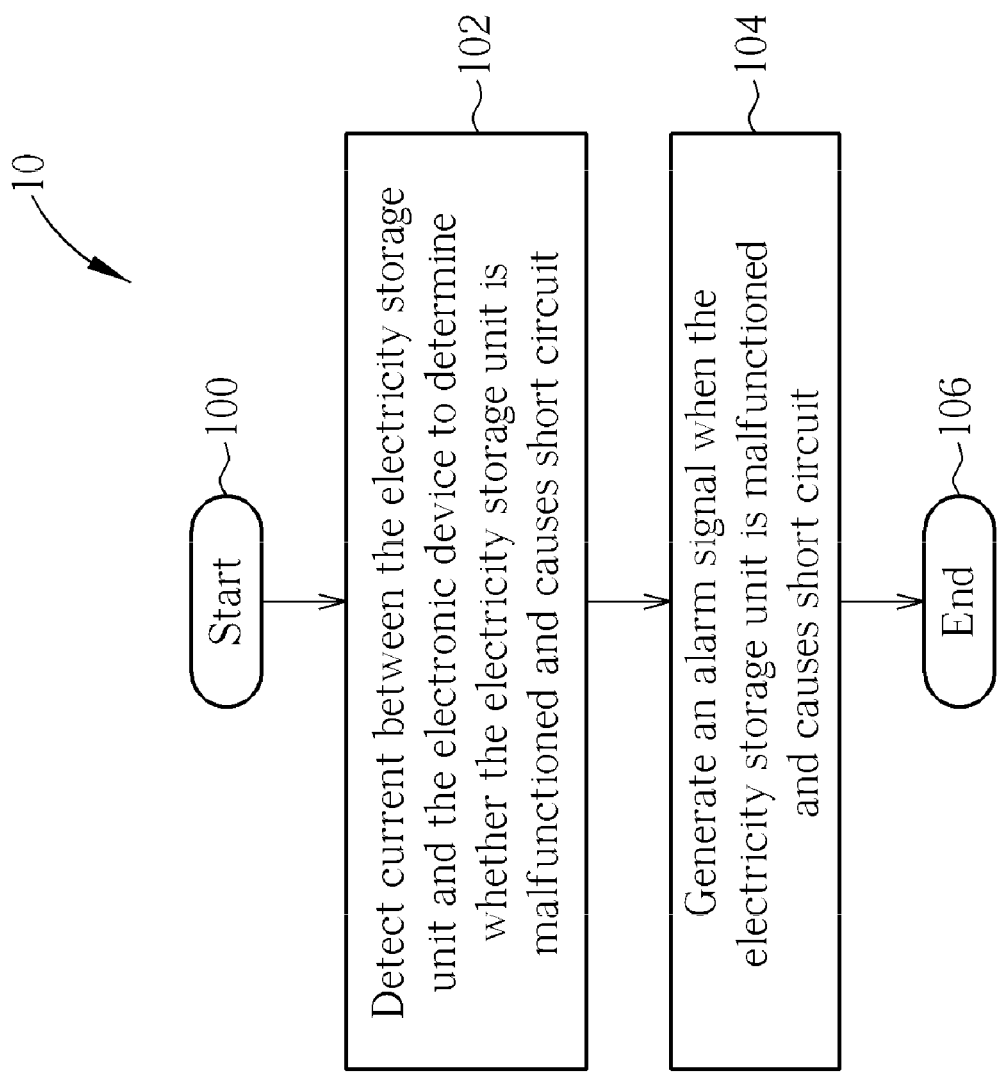
FIG. 1 is a flow chart of detecting operations of a power storage device according to a first embodiment of the present invention.

Please refer to FIG. 1, which is a flow chart of a process 10 for detecting operations of a power storage device according to a first embodiment of the present invention. The power storage device includes an electricity storage unit, such as a capacitor, and is used for storing power output from an electronic device or outputting power to the electronic device. The process 10 includes the following steps:

Step 100: Start.

Step 102: Detect current between the electricity storage unit and the electronic device to determine whether the electricity storage unit is malfunctioned and causes short circuit.

Step 104: Generate an alarm signal when the electricity storage unit is malfunctioned and causes short circuit.

Step 106: End.

According to the process 10, the present invention detects current between the electricity storage unit and the electronic device to determine whether the electricity storage unit is malfunctioned and causes short circuit. If the electricity storage unit is malfunctioned and causes short circuit, the present invention generates an alarm signal, such as a light source, to inform the user about the corresponding malfunction information.

In other words, when the electricity storage unit is malfunctioned, the present invention can instantly detect malfunction and generate an alarm signal to inform the user for preventing the related system from malfunction caused by power outage. Meanwhile, the present invention can generate a detecting result for the electronic device for corresponding protection, or cut off a connection between the electricity storage unit and the electronic device to prevent any impact on other elements.

Thus, through the process 10, the user is able to know whether the electricity storage unit is malfunctioned and prevent the related system from malfunction caused by power outage.

Figure 2:
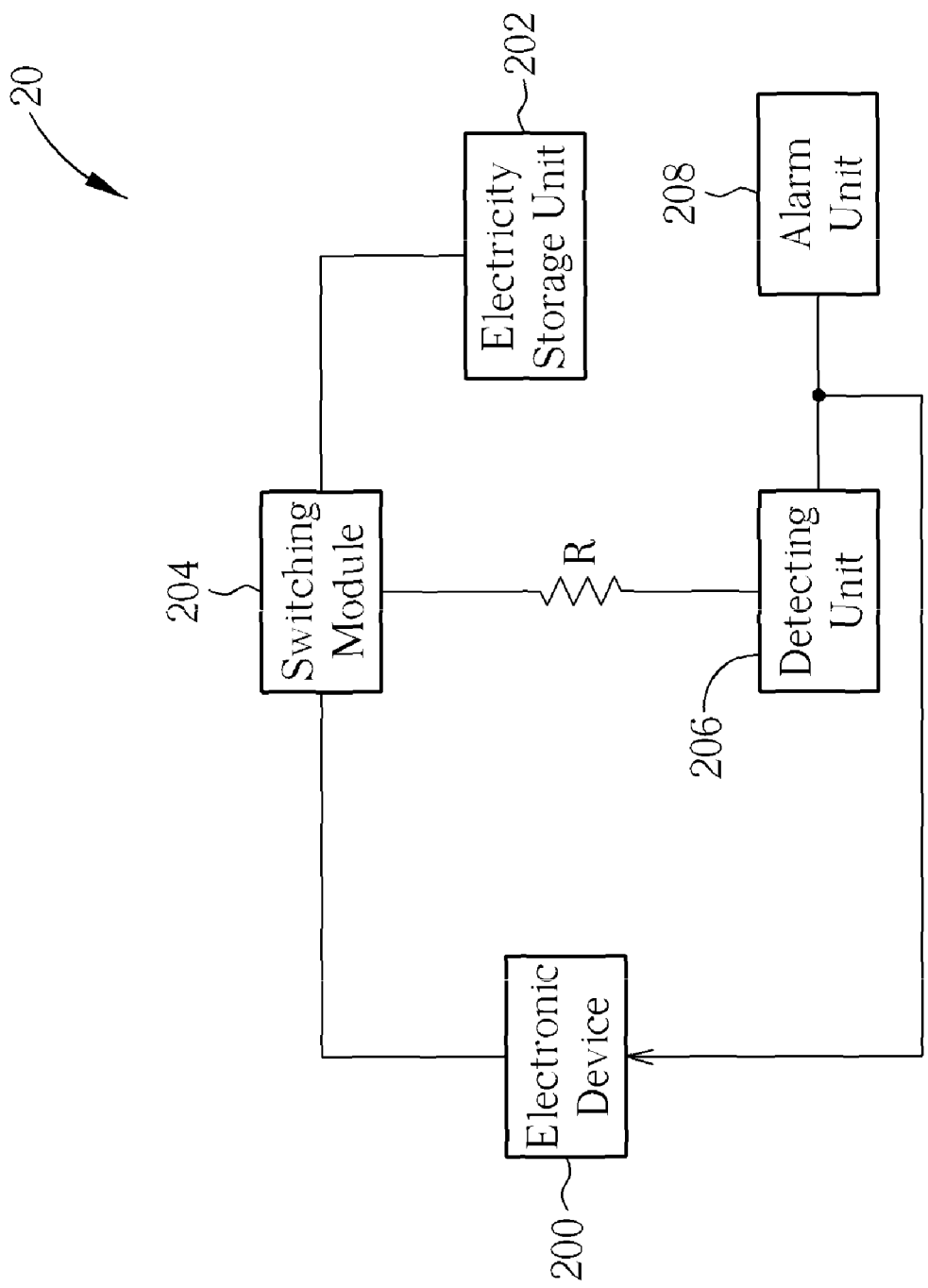
FIG. 2 is a schematic diagram of a power storage device capable of detecting operations according to the first embodiment of the present invention.

Regarding the implementation of the process 10, please refer to FIG. 2, which is a schematic diagram of a power storage device 200 capable of detecting operations according to the first embodiment of the present invention. The power storage device 20 is used for storing power output from an electronic device 200 or outputting power to the electronic device 200, and includes an electricity storage unit 202, a switching module 204, a detecting unit 206, an alarm unit 208 and a resistor R. The electricity storage unit 202, preferably, is a capacitor and used for storing power or outputting stored power. The switching module 204 is coupled between the electricity storage unit 202 and the electronic device 200, and used for controlling a connection between the electricity storage unit 202 and the electronic device 200 according to current between the electricity storage unit 202 and the electronic device 200. When the switching module 204 cuts off the connection between the electricity storage unit 202 and the electronic device 204, the detecting unit 206 detects current of the electricity storage unit 202 through the resistor R, and generates a detecting result to the alarm unit 208.

In short, in the power storage device 20, the switching module 204 controls the connection between the electricity storage unit 202 and the electronic device 200 according to current between the electricity storage unit 202 and the electronic device 200. Thus, the detecting unit 206 can timely detect current of the electricity storage unit 202 to determine whether the electricity storage unit 202 is malfunctioned and causes short circuit. If the detecting result generated by the detecting unit 206 indicates that the electricity storage unit 202 is malfunctioned, the alarm unit 208 generates an alarm signal to inform the user about the corresponding situation and prevents malfunction caused by power outage. In addiction, the detecting unit 206 can transmit the detecting result to the electronic device 200 via an interface, such as an Inter-integrated Circuit (I2C) so that the electronic device 200 can perform corresponding protections.

Figure 3:
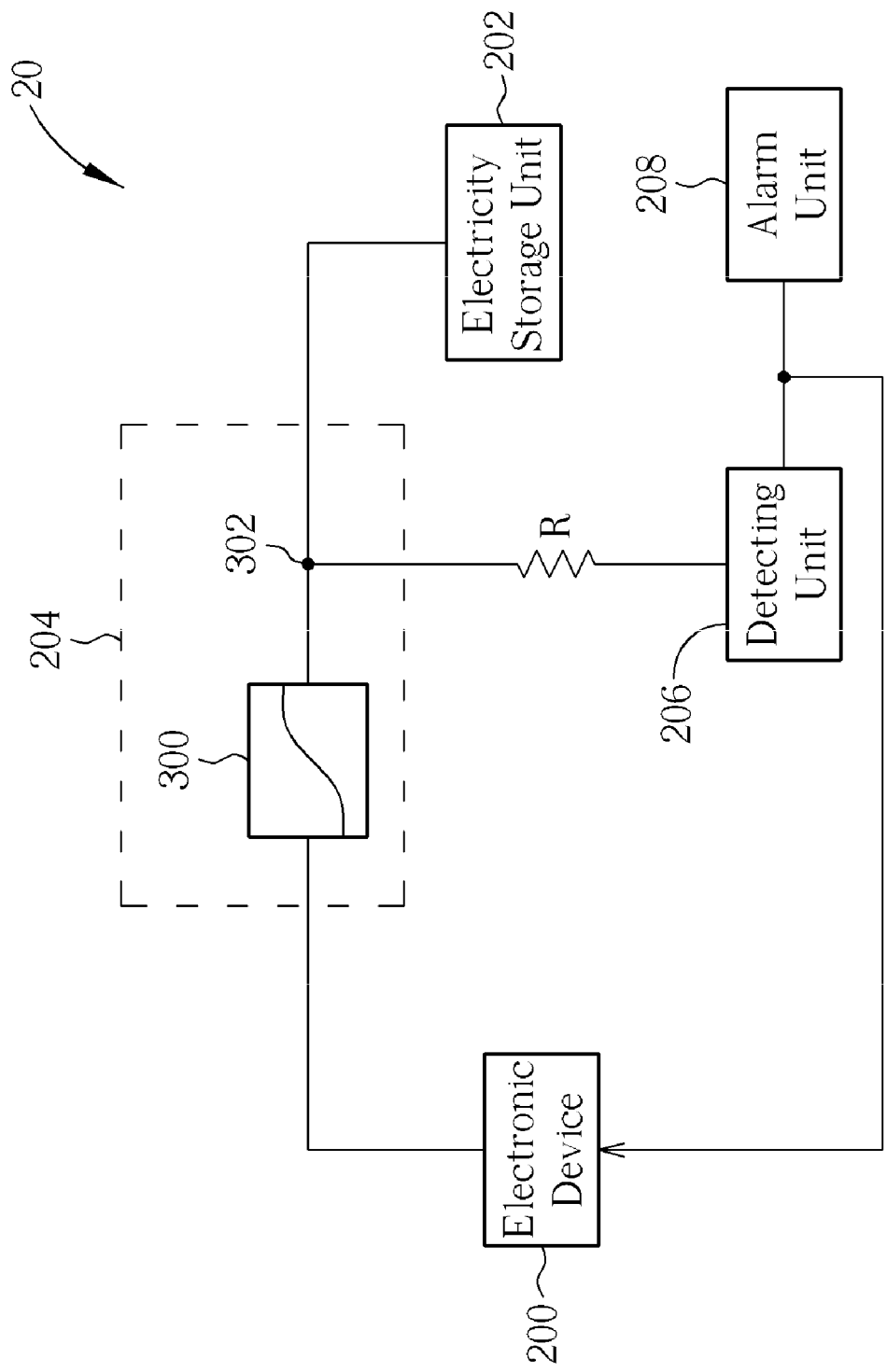
FIG. 3 and FIG. 4 are schematic diagrams according to a second and a third embodiments of the present invention.

Please note that, the power storage device 20 shown in FIG. 2 is a schematic diagram of the first embodiment of the present invention, and can be modified, based on different requirements, by those skilled in the art. For example, the alarm unit 208 can be a light emitting element, such as a light emitting diode (LED) used for generating a light source according to the detecting result generated by the detecting unit 206, to inform the user about malfunction of the electricity storage unit 202. On the other hand, the implementation of the switching module 204 is not restricted on any specific structure or method. Any circuit or element, capable of controlling the connection between the electricity storage device 202 and the electronic device 200 according to current between the electricity storage device 202 and the electronic device 200, can be used for realizing the switching module 204. For example, as shown in FIG. 3, the switching module 204 consists of a hot-melt element 300 and a node 302. The node 302 is formed between the resistor R and the hot-melt element 300. The hot-melt element 300 can be a fuse which is made of specific material and has an attribute of the low melting-point. Thus, when current between the electronic device 200 and the node 302 is greater than a predetermined value, the hot-melt element 300 will be blown.

Figure 4:
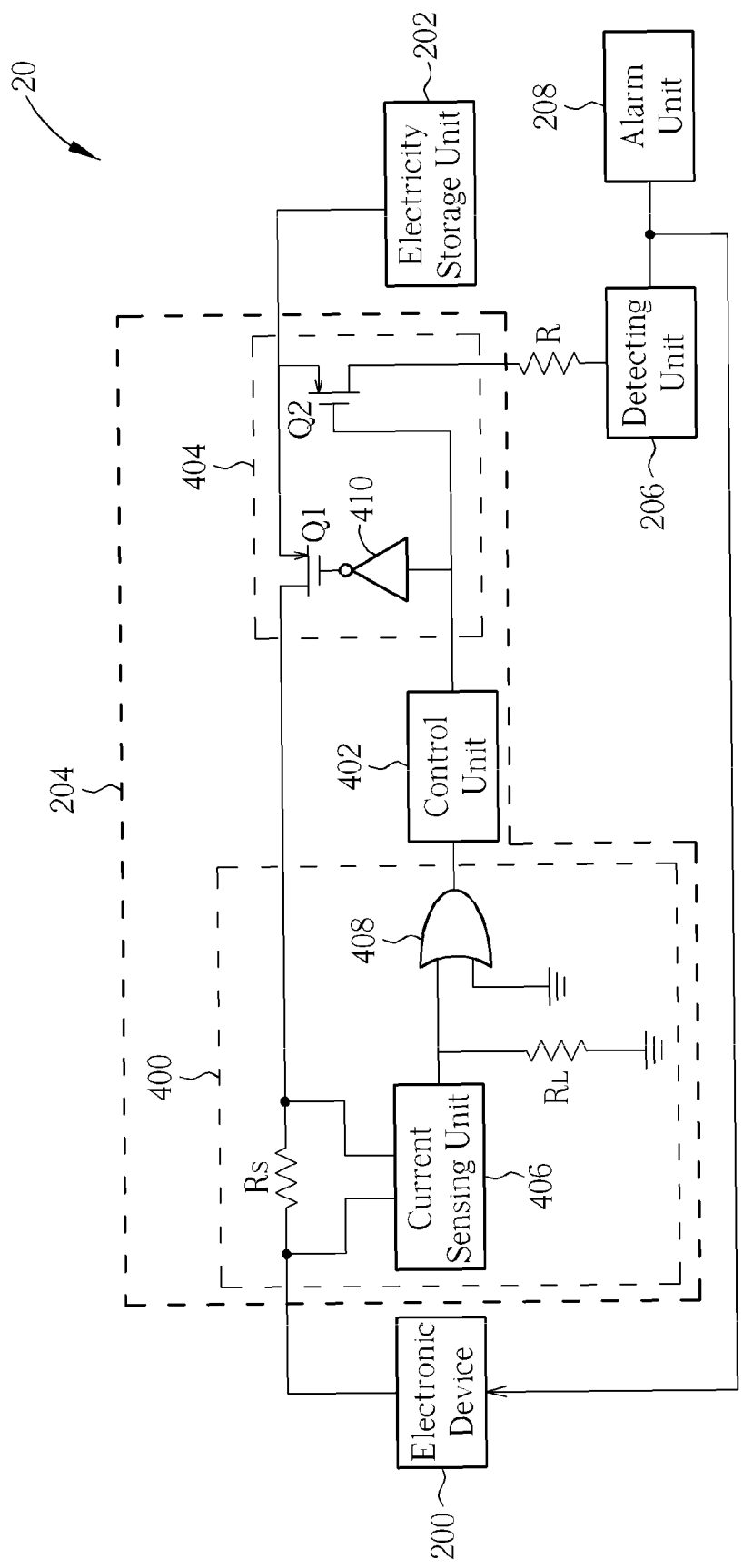

Furthermore, in FIG. 4, the switching module 204 includes a current sensing unit 400, a control unit 402 and a switch unit 404. The current sensing unit 400 includes a sensor 406, an OR gate 408 and resistors $R_S$, $R_L$. The sensor 406 is coupled across the resistor $R_S$ and used for sensing current flowing through $R_S$ so as to determine current between the electricity storage unit 202 and the electronic device 200. The resistor $R_L$ converts current, sensed by the sensor 406, into voltage and perform an OR operation with a ground voltage via the OR gate 408. The control unit 402 controls the switch unit 404 based on the OR operation result of the OR gate 408, to couple the electricity storage unit 202 to the detecting unit 206 or the current sensing unit 400. The switch unit 404 consists of p-type metal oxide semiconductor (PMOS) transistors Q1, Q2 and an inverter 410. When the control unit 402 outputs a high level signal, the PMOS transistor Q1 is off and the PMOS transistor Q2 is on. On the contrary, when the control unit 402 outputs a low level signal, the PMOS transistor Q1 is on and the PMOS transistor Q2 is off. By means of above-mentioned operations, the control unit 402 can timely detect whether the electricity storage unit 202 works well through the detecting unit 206. That is, when current flowing through the resistor $R_S$ is smaller than a predetermined value, the control unit 402 outputs a high level signal and the electricity storage unit 202 is coupled to the detecting unit 206 for performing detection. Contrarily, when current flowing through the resistor $R_S$ is greater than the predetermined value, the control unit 402 outputs a low level signal and the electricity storage unit 202 is coupled to the electronic device 200 through the current sensing unit 400, to perform charging or discharging. Consequently, the power storage device 20 can timely detect operations of the electricity storage unit 202 through the current sensing unit 400, the control unit 402 and the switch unit 404, and inform the user about the corresponding situation to prevent malfunction caused by power outage.

Please note that, FIG. 3 and FIG. 4 are used for illustrating a second and a third embodiments of the present invention, and can be modified, based on different requirements, by those skilled in the art. For example, if the detecting unit 206 is realized by a complex programmable logic device, the control unit 402 can be integrated with the detecting unit 206. Besides, the abovementioned description is stated for a single electricity storage unit. Practically, those skilled in the art can derive applications of multiple electricity storage units as shown in FIG. 5.

Figure 5:
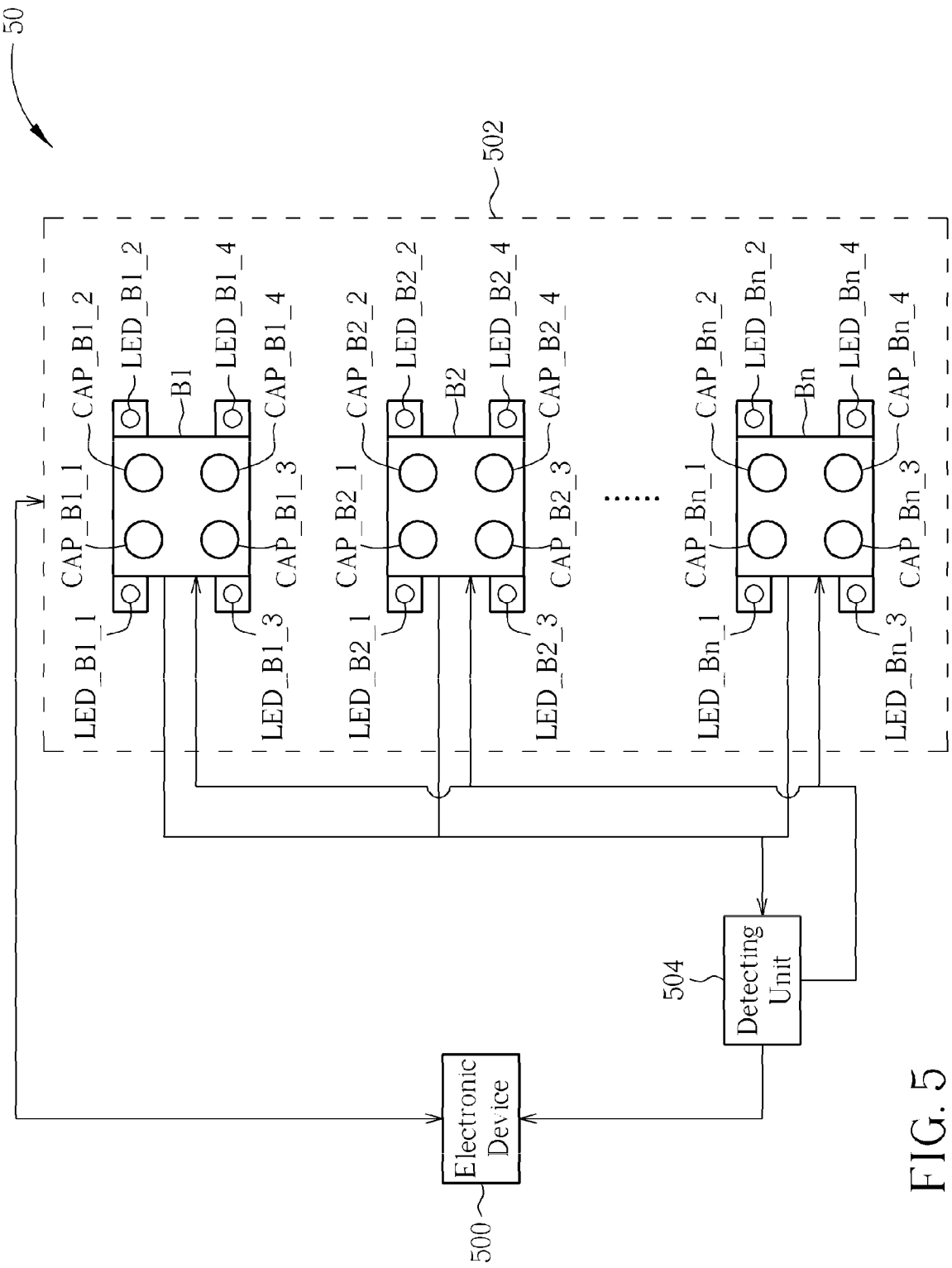
FIG. 5 is a schematic diagram of a power storage device capable of detection operations according to the second and the third embodiments of the present invention.

FIG. 5 is a schematic diagram of a power storage device 50 capable of detecting operations according to the second and the third embodiments of the present invention. The power storage device 50 is derived from the power storage device 20 shown in FIG. 2 and used for storing power output from an electronic device 500 or outputting power to the electronic device 500. For simplicity, only an electricity storage module 502 and a detecting unit 504 of the power storage device 50 are illustrated in FIG. 5. The other units can be referred to the power storage device 20 shown in FIG. 2. In the power storage device 50, the electricity storage module 502 includes battery cards B1-Bn, and each battery card includes four capacitors (CAP_B1_1-CAP_B1_4 . . . CAP_Bn_1-CAP_Bn_4) and four corresponding light-emitting diodes (LED_B1_1-LED_B1_4 . . . LED_Bn_1-LED_Bn_4). The capacitors CAP_B1_1-CAP_B1_4 . . . CAP_Bn_1-CAP_Bn_4 work as the electricity storage unit 202 in FIG. 2 as well as the light-emitting diodes (LEDs) LED_B1_1-LED_B1_4 . . . LED_Bn_1-LED_Bn_4 work as the alarm unit 208. The detecting unit 504 detects operations of the battery cards B1-Bn and controls on-off state of the corresponding LEDs. For example, if the capacitor CAP_B1_4 of the battery card B1 is malfunctioned and causes short circuit, the detecting unit 504 turns on the LED LED_B1_4 to inform the user about malfunction of the capacitor CAP_B1_4 and outputs the corresponding information to the electronic device 500 for undertaking the corresponding protection. In this situation, the user can know malfunction of the capacitor CAP_B1_4 when the LED_B1_4 is turned on. Thus, when any capacitor in battery cards B1-Bn is malfunctioned, the present invention turns corresponding LED on and instantly makes the user aware for preventing malfunction caused by power outage.

According to the prior art, the power device only possesses rechargeable function without any malfunction detection performed. This could cause the related system malfunctioned. In contrast, according to the present invention, the power storage device can detect malfunction and inform the user about the related information through the alarm unit such that the user can dispose accordingly. Moreover, the power storage device of the present invention can send malfunction information to the related system for undertaking the corresponding protection.

In conclusion, in the present invention, the power storage device can instantly detect malfunction and inform the user about the corresponding information to prevent the related system from malfunction caused by power outage.

Those skilled in the art will readily observe that numerous modifications and alterations of the device and method may be made while retaining the teachings of the invention.

What is claimed is:

1. A method for detecting operations of a power storage device comprising an electricity storage unit for storing power output from an electronic device or outputting power to the electronic device, the method comprising:
    detecting current between the electric storage unit and the electronic device to determine whether the electricity storage unit is malfunctioned and causes short circuit;
    generating an alarm signal when the electricity storage unit is malfunctioned and causes short circuit;
    a switching module, coupled between the electricity storage unit and the electronic device, for controlling a connection between the electricity storage unit and the electronic device according to current between the electricity storage unit and the electronic device;
    wherein the switching module comprises:
    a current sensing unit comprising a first terminal coupled to the electronic device, a second terminal and a third terminal, for sensing current between the first terminal and the second terminal and outputting a sensing result via the third terminal;
    a control unit, coupled to the third terminal of the current sensing unit, for outputting a control signal according to the sensing result; and
    a switch unit, coupled to the second terminal of the current sensing unit, the electricity storage unit, the control unit and the detecting unit, for coupling the electricity storage unit to either the current sensing unit or the detecting unit.

2. The method of claim 1, wherein generating the alarm signal when the electricity storage unit is malfunctioned and causes short circuit is generating a light source when the electricity storage unit is malfunctioned and causes short circuit.

3. The method of claim 1 further comprising:
    generating a detecting result when the electricity storage unit is malfunctioned and causes short circuit; and
    outputting the detecting result to the electronic device.

4. The method of claim 1 further comprising cutting off a connection between the electricity storage unit and the electronic device.

5. A power storage device capable of detecting operations, for receiving power output from an electronic device or outputting power to the electronic device, the power storage device comprising:
    an electricity storage unit for storing electricity or outputting stored electricity;
    a switching module, coupled between the electricity storage unit and the electronic device, for controlling a connection between the electricity storage unit and the electronic device according to current between the electricity storage unit and the electronic device;
    a detecting unit, coupled to the electricity storage unit, the switching module and the electronic device, for detecting current through the electricity storage unit and generating a detecting result when the switching module cuts off the connection between the electricity storage unit and the electronic device;
    an alarm unit, coupled to the detecting unit, for generating an alarm signal according to the detecting result;
    wherein the switching module comprises:
    a current sensing unit comprising a first terminal coupled to the electronic device, a second terminal and a third terminal, for sensing current between the first terminal and the second terminal and outputting a sensing result via the third terminal;
    a control unit, coupled to the third terminal of the current sensing unit, for outputting a control signal according to the sensing result; and
    a switch unit, coupled to the second terminal of the current sensing unit, the electricity storage unit, the control unit and the detecting unit, for coupling the electricity storage unit to either the current sensing unit or the detecting unit.

6. The power storage device of claim 5, wherein the switching module comprises:
    a node, formed between the electricity storage unit and the detecting unit;
    a hot-melt element, coupled between the node and the electronic device, for cutting off a connection between the node and the electronic device when current between the node and the electronic device is greater than a predetermined value.

7. The power storage device of claim 6, wherein the hot-melt unit is a fuse.

8. The power storage device of claim 5, wherein the current sensing unit comprises:
    a first resistor, coupled between the first terminal and the second terminal;
    a sensor, coupled between the first terminal and the second terminal for sensing current through the first resistor;
    a second resistor, having one terminal coupled to the sensor and the other terminal coupled to a ground end, for generating a first voltage according to current sensed by the sensor; and
    an OR gate, coupled to the third terminal between the sensor and the second resistor, for performing an OR operation on the first voltage and a predetermined voltage, and outputting the sensing result via the third terminal.

9. The power storage device of claim 5, wherein the predetermined voltage is a ground voltage.

10. The power storage device of claim 5, wherein the control unit outputs the control signal to the switch unit for coupling the electricity storage unit to the detecting unit when the sensing result indicates that current between the first terminal and the second terminal is smaller than a predetermined value, so as to detect current of the electricity storage unit via the detecting unit, and generate the detecting result.

11. The power storage device of claim 5, wherein the control unit outputs the control signal to the switching module for coupling the electricity storage unit to the current sensing unit when the sensing result indicates that current between the first terminal and the second terminal is greater than a predetermined value, so as to make the electricity storage unit to output power to the electronic device or store power output from the electronic device.

12. The power storage device of claim 5, wherein the switch unit comprises:
   an inverter, coupled to the control unit, for outputting an inverting result of the control signal;
   a first transistor having a gate electrode coupled to the inverting result of the inverter, a drain electrode coupled to the electricity storage unit, and a source electrode coupled to the second terminal of the current sensing unit; and
   a second transistor having a gate electrode coupled to the control signal of the control unit, a drain electrode coupled to the electricity storage unit, and a source electrode coupled to the detecting unit.

13. The power storage device of claim 5, wherein the first transistor and the second transistor both are p-type metal oxide semiconductor (PMOS).

14. The power storage device of claim 5, wherein the control unit and the detecting unit are integrated in a complex programmable logic device.

15. The power storage device of claim 5 further comprising an interface, coupled between the detecting unit and the electronic device, for outputting the detecting result generated by the detecting unit to the electronic device.

16. The power storage device of claim 5 further comprising a resistor having one terminal coupled to the switching module and the electricity storage unit, and the other terminal coupled to the detecting unit.

* * * * *